United States Patent [19]

Elwell, Jr.

[11] 4,278,557

[45] Jul. 14, 1981

[54] SOLVENT MIXTURE FOR DISSOLVING AND REMOVING EPOXY RESINOUS COMPOUNDS

[75] Inventor: John L. Elwell, Jr., Hooper, Utah

[73] Assignee: The United States of America as represented by the Secretary of the Air Force, Washington, D.C.

[21] Appl. No.: 140,640

[22] Filed: Apr. 15, 1980

[51] Int. Cl.³ .............................................. C11D 7/52
[52] U.S. Cl. .................................. 252/171; 252/162; 252/170; 252/172; 252/DIG. 8; 252/DIG. 9; 252/DIG. 10; 252/364; 134/38; 134/39; 134/40; 15/104.05; 106/311

[58] Field of Search ............... 252/171, 172, 170, 162, 252/DIG. 8, DIG. 9, DIG. 10, 364; 134/38, 39, 40; 15/104.05; 106/311

[56] References Cited

U.S. PATENT DOCUMENTS

| 3,147,224 | 9/1964 | Gauntt et al. | 252/171 X |
| 3,625,763 | 12/1971 | Melillo | 252/171 X |

*Primary Examiner*—Mayer Weinblatt
*Attorney, Agent, or Firm*—Donald J. Singer; William J. O'Brien

[57] ABSTRACT

A solvent solution for dissolving and removing epoxy resinous formulations. The solution is composed of a mixture of methanol, dichloromethane and distilled water as essential components.

2 Claims, No Drawings

SOLVENT MIXTURE FOR DISSOLVING AND REMOVING EPOXY RESINOUS COMPOUNDS

STATEMENT OF GOVERNMENT INTEREST

The invention described herein may be manufactured and used by or for the Government for governmental purposes without the payment of any royalty thereon.

BACKGROUND OF THE INVENTION

This invention relates to a solvent composition. In a more particular aspect, this invention concerns itself with a solvent mixture that is particularly adapted for use in dissolving and removing epoxy resinous formulations such as epoxy rigid foams, paints and cured resins.

The epoxy resins constitute a rather large class of thermosetting, polyether, resinous intermediates which are generally formed through a polymerization reaction between bisphenol and epichlorohydrin. The uncured intermediate is of no particular value until it is reacted or hardened through the use of a variety of hardening of curing agents. When cured or hardened, the resinous material finds wide application for use as coatings, adhesives, castings and foams. Laminates of epoxy resins and glass cloth have been utilized in the repair of damaged automobile and small boat hulls. One of their more important modern day uses resides in their application as a foam encapsulant for electronic components and circuit boards. Unfortunately, the inherent solvent resistance of epoxy resins presents certain problems. Great difficulty is encountered in removing the protective encapsulant from the electronic component in order to effect repair or replacement of any of the individual units making up the electronic component or the electronic circuit board. Heretofore, it was necessary to grind or burn the foam encapsulant or, in the alternative, rely on a number of corrosives solvents which utilized strong acid or basic catalysts as the primary component of the solvent mixture. Oftentimes, the use of grinding techniques or strong solvents resulted in excessive physical damage to the electronic component. In addition, corrosion often occurred resulting in even greater damage. As a result, the repair or replacement of component parts could not be undertaken and the components had to be discarded at a large economic loss.

In order to avoid economic loss, hazardous health conditions from the corrosive solvent vapors, health hazards from the pyrolisis of the coatings and, most importantly, facilitate the repair and maintenance of electronic components, it was found necessary to develop a novel solvent mixture that would be effective in dissolving and removing epoxy resins whether in the form of a thick coating, paint-like coating, foam encapsulant or foamed structure.

As a result of the research effort generated for the purpose of providing for the effective removal of epoxy resins, it was found that a mixture containing dichloromethane, methanol and distilled water provided a solvent that overcame the problems associated with prior art methods utilized in the removing and dissolving of epoxy resins.

SUMMARY OF THE INVENTION

The present invention concerns itself with a solvent mixture that is especially adapted for dissolving and removing epoxy resinous coatings, cured epoxy adhesive used to join metals, and other epoxy resinous materials such as the rigid epoxy foam encapsulants that are used to coat various electronic components. The solvent mixture is effective in removing the epoxy compounds strictly through a solvent activity without the need nor desirability for an additional abrading or grinding action. Grinding often inflicts excessive damage on epoxy encapsulated electronic components. The solvent solution consists essentially of a mixture of methanol, dichloromethane and distilled water. The solvent mixtures effectiveness results from solvent polarity and slight hydrolysis of the resin crosslinks. Primarily, the novel feature of the solvent mixture resides in the fact that good activity in dissolving and removing the epoxy resinous formulations is obtained without the need for an acid or base catalyst, the components of prior art solvent mixtures. Also, the mixture of dichloromethane and methanol is essentially saturated with distilled water and it is believed that this saturation point provides added solvent activity. The solvent action of the mixture of this invention achieves maximum swelling which effects the adhesive bond of the epoxy compound facilitating its easy removal with little or no damage to the epoxy encapsulated electronic components or to epoxy coated substances.

Accordingly, the primary object of this invention is to provide a solvent solution that is particularly adapted for dissolving and removing epoxy resinous formulations.

Another object of this invention is to provide a solvent solution that effectively removes epoxy coating paints and foamed encapsulants through solvent activity alone without resort to the use of ancillary abrading techniques.

Still another object of this invention is to provide a solvent solution for dissolving epoxy resinous coating compounds that does not rely on the use of acid or base catalysts thereby minimizing the problem of corrosion normally associated with previously known epoxy solvents.

The above and still other objects and advantages of the present invention will become more readily apparent upon consideration of the following detailed disclosure of a preferred embodiment of the invention.

DESCRIPTION OF THE PREFERRED EMBODIMENT

In accordance with this invention, it has been found that the aforementioned objects of this invention can be put into effect by a solvent solution that exhibits slight solvation properties coupled with maximum swelling and degassing properties. The swelling action affects the adhesive bonding of the various types of epoxy compounds such as coating, paints or foams thereby facilitating easy removal of the epoxy compound with minimal damage to the substrate of component to which the epoxy compound is adhesively bonded.

In order to more clearly describe the present invention and point out with particularity the nature of the solvent solution contemplated thereby, the following example is presented. It should be understood however that the example is presented to illustrate the invention and it is not intended to limit the invention in any way.

EXAMPLE

| Ingredient | Percent by Volume |
| --- | --- |
| Methanol (CH$_3$OH) | 45% |

EXAMPLE-continued

| Ingredient | Percent by Volume |
| --- | --- |
| Dichloromethane ($CH_2Cl_2$) | 40% |
| Distilled water ($H_2O$) | 15% |

The solution illustrated in the example above has been successfully used to remove rigid epoxy foam encapsulants from electronic components as well as to remove cured epoxy resin adhesives from cojoined metal parts. Additionally, it has found utility in the removal of epoxy paint-like coatings from various aircraft components. Also, use of the solvent mixture allowed for the easy removal of epoxy foams from encapsulated electronic components thereby facilitating their repair. The solvent mixture caused minimal damage to electronic components and was non-corrosive to most metals.

The invention is best put into effect by preparing a suitable volume of the solvent mixture having a compositional content as shown in the Example. The component or component part that is coated, painted or encapsulated with an epoxy formulation is then immersed into the solvent mixture. If desired, a cellulose thickener may be added for stripping epoxy paints from large surfaces. The coated part is then exposed to the action of the solvent for a period of time sufficient to soften the epoxy at which time the part is removed from the solvent mixture by merely scraping, washing or through the use of water or gas pressure. The removal time will vary since it is highly dependent upon the particular epoxy formulation being removed. The cleansed part may then be rinsed with methanol or dichloromethane, if desired, in order to allow more rapid drying.

Utilization of the solvent mixture of this invention eliminates pyrolixis techniques which were also relied upon in the past for removing coatings from electronic circuit boards. It facilitates their repair and maintenance and minimizes the serious health hazards encountered by persons using prior art solvents. It also allows for the repair of foamed encapsulated electronic components which were previously discarded because no effective method was available for dealing with foam encapsulants. In addition, the solvent solution provides for the rapid and effective removal of epoxy insulation from metal panels without resorting to the prior art technique of grinding and abrading which often resulted in severe damage to the surface of the panels.

While there has been described a particular embodiment of the invention, it should be understood by those skilled in the art to which the subject matter of the present invention pertains that various alterations and modifications may be resorted to without limiting the invention in any way, the scope of which is defined by the appended claims.

What is claimed is:

1. A solvent solution for effectively removing epoxy resinous formulations from a substrate, said solution consisting essentially of a mixture of about 45 volume percent methanol, about 40 volume percent dichloromethane and about 15 volume percent distilled water.

2. A solvent solution in accordance with claim 1 and further including the addition of a cellulose thickener to facilitate the removal of said epoxy resinous formulation from a large surface area substrate.

* * * * *